United States Patent [19]

Pesola

[11] Patent Number: 5,164,884
[45] Date of Patent: Nov. 17, 1992

[54] DEVICE FOR COOLING A POWER TRANSISTOR

[75] Inventor: Mikko Pesola, Salo, Finland

[73] Assignee: Nokia Mobile Phones, Ltd., Salo, Finland

[21] Appl. No.: 662,760

[22] Filed: Feb. 28, 1991

[30] Foreign Application Priority Data

Mar. 29, 1990 [FI] Finland .................. 901582

[51] Int. Cl.[5] .............................. H05K 7/20
[52] U.S. Cl. .................. 361/386; 361/387; 361/389; 361/397; 361/400; 165/803; 165/185; 174/16.3; 174/52.2; 357/80; 357/81
[58] Field of Search ............... 361/386, 387, 388, 389, 361/397, 400, 401, 404, 405; 165/185, 80.3; 174/16.3, 52.2; 357/80, 81

[56] References Cited

U.S. PATENT DOCUMENTS

| | | | |
|---|---|---|---|
| 3,517,272 | 6/1970 | Lee et al. | 317/100 |
| 3,859,570 | 1/1975 | Veranth et al. | 317/100 |
| 4,935,581 | 6/1990 | Komathu | 174/52.4 |
| 5,021,925 | 6/1991 | Soboleski | 361/386 |

FOREIGN PATENT DOCUMENTS 2918845 11/1980 Fed. Rep. of Germany.
3342923 6/1985 Fed. Rep. of Germany.

OTHER PUBLICATIONS

Mandel et al., Heat Dissipator Assemblies, Mar. 1966, IBM Technical Disclosure Bulletin, vol. 8, No. 10.
Harry Swanson, *Mounting Techniques for Powermacro Transistor,* Motorola RF Device Data, 6-190-6-192.

Primary Examiner—Leo P. Picard
Assistant Examiner—Young S. Whang
Attorney, Agent, or Firm—Darby & Darby

[57] ABSTRACT

The invention relates to a cooling construction for cooling a power transistor (4) having a plastic encapsulation, wherein the waste heat produced is conducted away mainly via the collector lead (6), the collector lead being connected to the collector strip (3) on the circuit board. When it is desired to conduct the produced waste heat specifically on the component side of the circuit board (1), it is possible to use a construction according to the invention in which there is placed on the circuit board (1) a highly heat conductive insulation plate (8) which covers the collector strip (3) entirely over part of its length next to the transistor (4), and that to the insulation plate (8) there is fixed a cooling plate (9) to which the thermal energy produced in the transistor is conducted. The insulation plate (8) may in part also extend on top of the plastic encapsulation of the transistor.

7 Claims, 1 Drawing Sheet

DEVICE FOR COOLING A POWER TRANSISTOR

BACKGROUND OF THE INVENTION

The present invention relates to a construction or a device for cooling a power transistor having a plastic case, wherein the waste heat produced is directed away mainly via the collector lead, the collector load being connected to a collector strip on the circuit board.

Nowadays the RF power transistors used are rather commonly transistors having a plastic encapsulation, often having such a structure that the ends of the collector lead, base lead and often two emitter leads, by means of which the semiconductor piece itself can be connected to the surrounding circuitry, are inside the cast plastic encapsulation. The collector lead is a flat strip considerably wider than the others, and the semiconductor piece itself is on top of this strip. Inside the encapsulation there are connecting leads from the transistor chip to the base and emitter leads. The collector lead may be a few millimeters wide, and owing to the structure presented above it functions as the principle means of transferring the waste heat produced in the transistor into the surroundings. The transistor can be connected to the circuit board by welding the above-mentioned connecting leads directly to the circuit board. Such transistors are used when rather low power levels are involved, in which encapsulation the power loss may be in the order of a couple of watts.

The cooling of transistors such as this is, of course, based on cooling the collector lead of the transistor in a suitable manner. The easiest, although not the most effective, way is to weld the collector lead of the transistor directly to the collector strip on the circuit board, in which case heat will transfer from the collector to the strip on the circuit board and via it further through the circuit board to the continuous metal foil serving as the ground, from which it is transferred into air. This method is not especially effective, because the insulation material of the circuit board itself also serves as a heat transferer, and this material is selected primarily considering its electric properties and not paying attention to its heat transfer properties. It would, of course, be possible to use as the circuit board substrate, instead of the conventional glass-fiber-epoxy material, a suitable ceramic material having good heat transfer properties, but such material is expensive and making in it the various holes needed in the coupling of the components is difficult owing to the hardness of the material.

Another known method is to use a special mounting seat for transistors, fixed to the circuit board for example by means of screws. This seat may be a specially designed metal plate with a large surface area, in the middle of which the transistor is placed. On the surface of the plate there are located electrically insulating but highly heat conductive ceramic pieces over which the collector lead and base lead run, without touching the material of the seat, to the conductor strips of the circuit board. In common-emitter connection the emitter can be connected directly to the seat plate. From the collector lead of the transistor the heat is transferred via a ceramic piece to the seat plate which, having a large surface area, effectively transfers heat to the surroundings both directly and by conducting part of it through the circuit board substrate to the metal foil serving as the ground. This known method is, however, rather complicated and in practice difficult to implement.

One further method of improving cooling is depicted in Finnish Patent Application FI-890791, Nokia-Mobira Oy. In the method described, a thick metal strip is used which is welded on top of the collector strip on the circuit board, the collector lead of the transistor being also welded to the strip. The lead may be in end-to-end contact with the thick metal strip. The waste heat is partly conducted directly from the metal strip into air and partly through the circuit board to the ground foil on the opposite side and from there further into air. The transfer of heat can be enhanced by fixing to the surface of the ground various elements which promote cooling. This method is rather effective and is, furthermore, simple to implement.

It can be stated in general that in a number of practical RF circuitries it is advantageous if a major portion of the waste heat is conducted through the circuit board from the component side to the ground side and from there either directly or, enhanced by additional elements, into air. This is the case especially when the mechanical structure of the device is such that the RF circuit part is on the component side entirely shielded by an RF-tight cover and a continuous ground foil serves as a shield on the other side. In this case the RF shield cover weakens the transfer of heat into air, and so the transfer must in the main be through the circuit board substrate. In such cases the prior-art heat transfer systems described above are usable. However, there are mechanical devices in which it is necessary to cause as large a proportion as possible of the waste heat produced by a low-power transistor to be conducted into air on that side of the circuit board where this component is. The construction according to the present invention provides a system for a need such as this.

SUMMARY OF THE INVENTION

The construction according to the invention is characterized in that on the circuit board there is tightly placed an insulation plate which conducts heat well and covers the collector strip entirely over part of its length next to the transistor, and that to the insulation plate there is fixed a cooling plate to which the thermal energy produced in the transistor is conducted.

The use of heat-conductive insulation plates is common in the insulation of low-frequency power transistors from a cooling plate. In such use the transistor is fixed by a screw to a metal cooling plate, and between the plate and the transistor there is a heat conductive insulation plate. The insulating material used is conventionally mica plate, but the plate may also be silicon with a ceramic material, e.g. alumina, as the filler. The high-frequency properties of both these materials are tabulated in accompanying Table 1.

TABLE 1

|  | $\epsilon_r$/tan$\delta$ (1 MHz) | $\epsilon_r$/tan$\delta$ (3 GHz) |
|---|---|---|
| alumina | 8.8/0.0003 | 8.8/0.001 |
| silicon rubber compound | 3.2/0.003 | 3.1/0.01 |
| FR-4 substrate | 4.5/0.02 |  |
| rose mica | 5.4/0.0003 | 5.4/0.0003 |

The high-frequency properties of both materials are good, as shown in the table, and so they can be used in accordance with the invention for transferring heat between the power transistor collector strip and the cooling plate. Owing to their elasticity, silicon-based materials can be deemed to be more usable.

BRIEF DESCRIPTION OF THE DRAWINGS

The invention is described in greater detail with reference to the accompanying figures, in which.

DETAILED DESCRIPTION OF THE PREFERRED EMBODIMENTS

Figure 1:
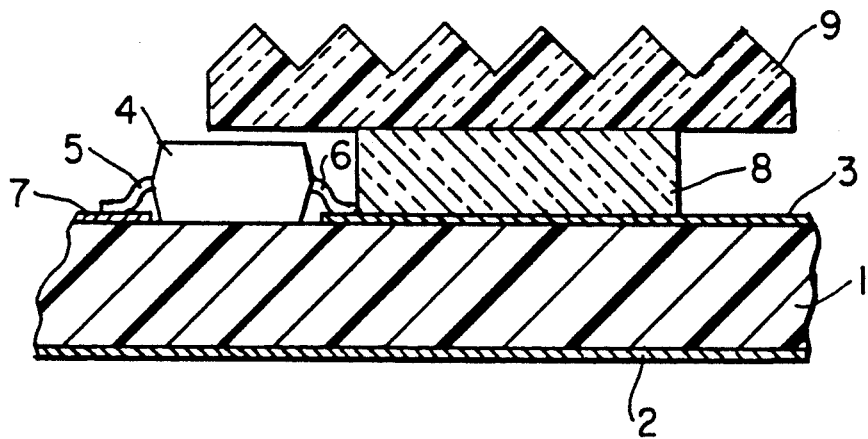
FIG. 1 shows a side view of a construction according to the invention for cooling an RF transistor having a plastic encapsulation.
Figure 2:
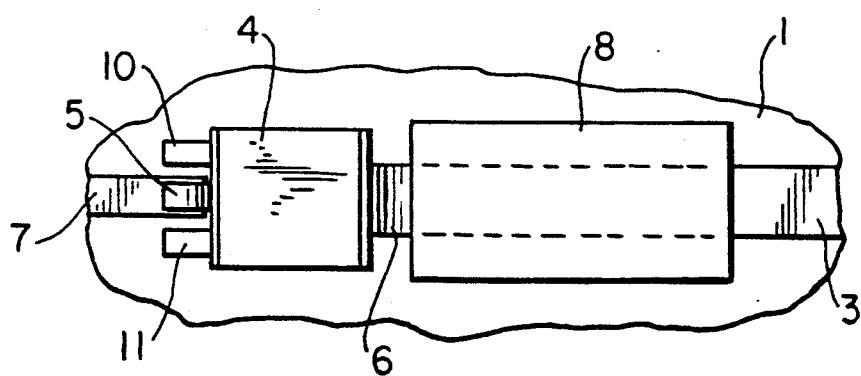
FIG. 2 depicts a top view of the construction according to FIG. 1 as seen without the cooling plate.

In the figures, reference numeral 4 indicates a power transistor having a plastic encapsulation, in which the thermal losses are conducted away by mediation of a wide collector lead. The transistor is fixed by welding it by its connecting leads 5, 6, 10 and 11 to strips on the circuit board. The base lead 5 is connected to the strip 7 and the collector lead 6 to the strip 3. The connection of the emitter leads 10, 11 is not shown. In radio frequency applications there is on the opposite surface of the circuit board a metal foil 2 which serves as the ground. According to the invention, a highly heat conductive insulation plate 8 of predetermined surface area and thickness is placed on top of the collector strip 3, the insulation plate being highly heat conductive. The plate will cover the collector strip entirely over a certain distance. The fixing can be, for example, by gluing. To that surface of this insulation plate which faces away from the circuit board there is fixed in a suitable manner a cooling plate 9, the surface area and thickness of which can be calculated from known heat transfer formulae. The use of a heat conductive plate 8 between the collector strip 3 and the grounded cooling plate 9 will reduce the impedance of the strip 3, but this can be taken into account already at the planning stage by suitably narrowing the collector strip 3. When the cooling plate 9 is grounded and the dielectricity constant $\epsilon_r$ of the heat conductive insulation plate 8 is approximately the same as the dielectricity constant of the circuit board substrate 1, the collector strip 3 will form a transfer stripline the dimensioning of which is relatively simple.

It can be mentioned as a practical example that the thermal resistance of the materials in Table 1 is, for example, for an 0.25 mm plate in the order of 2 K cm$^2$/W. If, for example, the permitted temperature loss across the material thickness is 10 K and the power to be transferred is 1 W, the required surface area of the insulation plate 8 would be 0.2 cm$^2$ If the thickness of the plate is increased to 1 mm, the required surface area of the plate 8 will respectively increase to 0.8 cm$^2$.

The above description relating to the figures does not in any way limit the invention; the implementation can vary greatly within the spirit of the protective scope. The heat conductive material used may be any suitable material having a sufficiently high dielectricity constant and good high-frequency properties and thermal conductivity properties.

Figure 3:
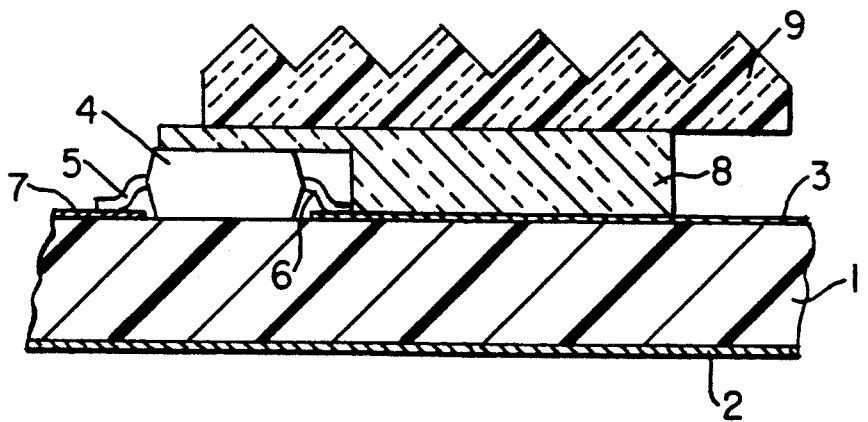
FIG. 3 shows a side view of another embodiment of the device according to the invention.

The heat conductive plate of material can be placed on top of the collector strip 3 and also in part or entirely on top of the plastic encapsulation of the transistor as shown in FIG. 3 in which case the thermal energy coming through the encapsulation can also be transferred away more effectively. Also, nothing prevents the use, if the construction so requires, of an extra cooling plate fixed to the foil 2 functioning as the ground.

I claim:

1. An arrangement for cooling a lower transistor which is connected to a circuit board and has a plastic encapsulation, comprising:
   a collector strip in the form of a strip of hat conductive material mounted on the circuit board and connected to a collector led of the transistor such that heat produced in the transistor is mainly conduced away from the transistor along the collector strip;
   a heat conductive insulation plate arranged adjacent to the transistor and positioned over at least a portion of said collector strip, said insulation plate being in high thereat transfer contact with the circuit board an the strip; and
   a cooling plate mounted on said insulation plate such that heat produced in the transistor is conducted to said strip from said collector strip to said insulation plate and from said insulation plate to said cooling plate.

2. The arrangement according to claim 1 wherein the insulation plate extends to entirely cover the transistor.

3. The arrangement according to claim 1 wherein said insulation plate at least partially covers the transistor.

4. The arrangement according to claim 1 wherein said insulation plate is made of mica.

5. The arrangement according to claim 1 wherein said cooling plate comprises a separate metal plate, said insulation plate having a surface abutting said metal plate.

6. The arrangement according to claim wherein said insulation plate is made of silicon having a ceramic material filler.

7. The arrangement according to claim 6 wherein the ceramic material is alumina.

* * * * *